United States Patent [19]
Miyahara et al.

[11] Patent Number: 5,942,765
[45] Date of Patent: Aug. 24, 1999

[54] HIGH-TEMPERATURE SUPERCONDUCTING RANDOM ACCESS MEMORY

[75] Inventors: Kazunori Miyahara, Ibaraki-ken; Yoichi Enomoto; Shoji Tanaka, both of Tokyo, all of Japan

[73] Assignee: International Superconductivity Technology Center, Tokyo, Japan

[21] Appl. No.: 08/975,108

[22] Filed: Nov. 20, 1997

[30] Foreign Application Priority Data

Nov. 25, 1996 [JP] Japan .................................... 8-313228

[51] Int. Cl.$^6$ .................................................. H01L 29/06
[52] U.S. Cl. .............................. 257/33; 257/34; 257/36; 365/162; 505/190
[58] Field of Search ................................. 257/31, 33, 34, 257/36; 365/160, 161, 162; 505/190; 327/528

[56] References Cited

U.S. PATENT DOCUMENTS

| | | | |
|---|---|---|---|
| 4,509,146 | 4/1985 | Wang et al. | 365/162 |
| 4,601,015 | 7/1986 | Ishida | 365/162 |
| 4,764,898 | 8/1988 | Miyahara et al. | 365/162 |
| 5,227,645 | 7/1993 | Shinada | 257/34 |
| 5,629,889 | 5/1997 | Chandra et al. | 365/162 |

*Primary Examiner*—Sara Crane
*Attorney, Agent, or Firm*—Armstrong, Westerman, Hattori, McLeland & Naughton

[57] ABSTRACT

In the random access memory utilizing an oxide high-temperature superconductor, a first high-temperature superconductor layer 1, a non-superconductor layer 2, a second high-temperature superconductor layer 3 and a non-superconductor layer 4 are formed on an insulated substrate. The first high-temperature superconductor layer 1 is formed in a first loop, forming a memory storage superconductor quantum interference device by two Josephson junctions and a control current line $I_{WX}$ (6) and a bias current line $I_{WY}$ (8) in order to store the flux quantum. The second high-temperature superconductor layer 3 is formed in a second loop, forming a reading superconducting quantum interference device by two Josephson junctions and a control current line $I_{RX}$ (5) and a bias current line $I_{RY}$ (7). By use of the characteristic where the output is occurred according to the polarity of the flux quantum held by the first loop, the writing and reading of the memory is done by a binary logic of "0" and "1", and functions as a random access memory.

7 Claims, 4 Drawing Sheets

± φ₀ WRITING OPERATION

READING OPERATION

HIGH-TEMPERATURE SUPERCONDUCTING RANDOM ACCESS MEMORY

TECHNICAL FIELD OF THE INVENTION

The present invention relates to a high-temperature superconducting random access memory operable at a temperature of approximately 20K or more. More particularly, it relates to a random access memory (RAM) which has low power consumption and operates in high speed, which has a possibility to be applied to a high-speed, large capacity superconducting cash memory for computers, or data processing memory of a high speed, large capacity data communication system.

BACKGROUND OF THE INVENTION

The superconducting memory having an operating principle which is close to the one of the present invention is the "vortex memory" operated in liquid helium temperature (4.2K) utilizing a metal low-temperature superconductor, which has already been proposed and tested.

The vortex memory is taught in the following documents: "Abrikosov vortex memory"; K. Miyahara et al. (NTT) Appl. Phys. Lett. 47(7), P.754 (1985); U.S. Pat. No. 4,764,898, Aug. 16 (1988) (NTT); Japanese Patent No. 1668743, May 29, 1992 and eleven other patents (NTT).

The technique taught by said documents utilized low-temperature superconductors, and by the prior art, a superconducting RAM operated in a temperature of over 20K could not be realized. In the present invention, such memory is realized and a data processing device of high speed and large capacity operated in a temperature of over 20K is realized.

SUMMARY OF THE INVENTION

The present invention utilizes a three-layer structure of an oxide high-temperature superconductor—non-superconductor—oxide high-temperature superconductor, and by use of a Josephson junction formed by irradiating a focused ion beam (FIB), one loop utilized as the memory information storage loop and the other utilized as the memory information detecting loop, a high-temperature superconducting RAM is realized.

DETAILED DESCRIPTION

Utilizing NdBaCuO single crystal as the substrate, a PrBaCuO thin film is epitaxially grown on the surface thereof. Then, FIB is irradiated on one portion of said surface of the PrBaCuO thin film, and then a NdBaCuO thin film and a PrBaCuO thin film is epitaxially grown, forming a Josephson junction of the lower layer. Then again, FIB is irradiated on one portion of the surface of the PrBaCuO thin film, and then a NdBaCuO thin film and a PrBaCuO thin film is epitaxially grown, forming a Josephson junction of the upper layer. Next, the upper NdBaCuO—PrBaCuO layer film and the lower NdBaCuO—PrBaCuO layer film is etched twice to form a superconducting loop including two FIB Josephson junctions which is two-junction superconducting quantum interference device (DC-SQUID) and a bias current line by the upper layer and the lower layer of the layered film. Then, a control current line connected magnetically to said each superconducting loops are formed by growing a metal thin film and providing a lift-off process thereto.

[Preferred Embodiment]

Figure 1:
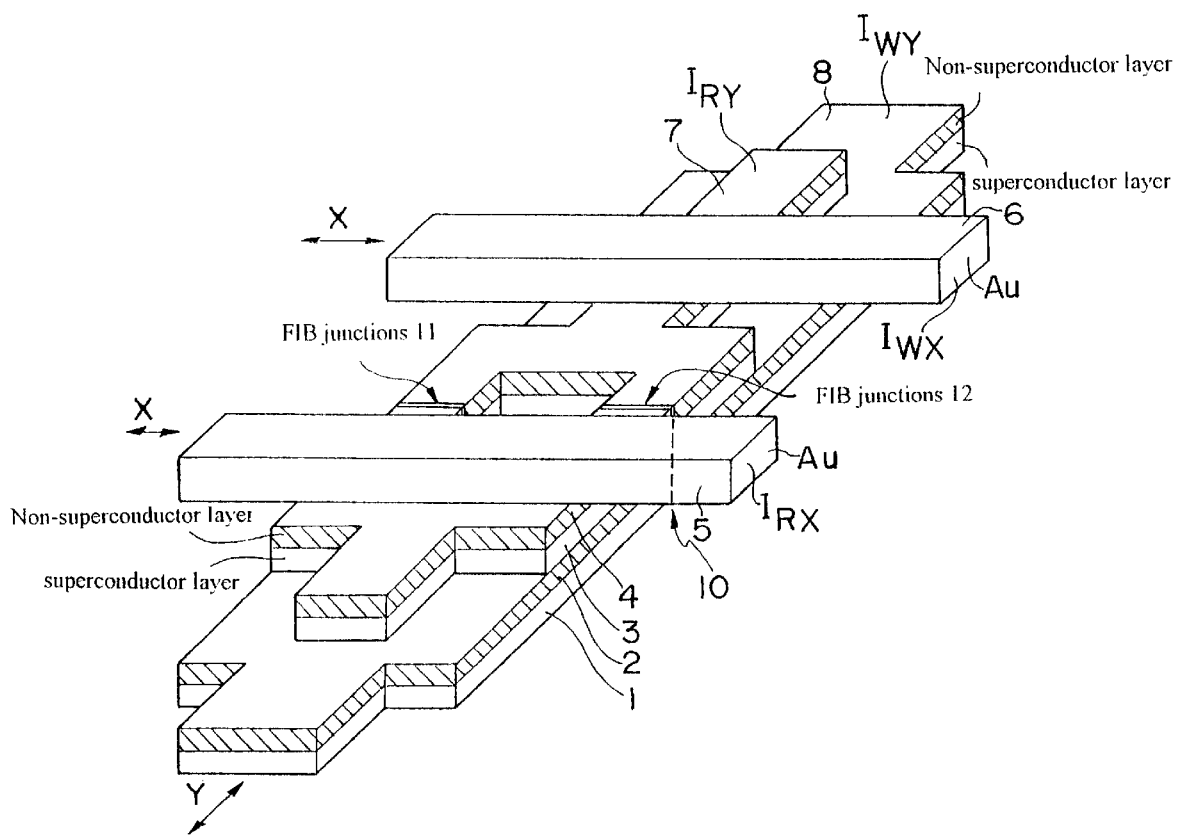
FIG. 1 is a concept view showing the structure of the memory cell constituting the random access memory of the present invention.

The present invention constitutes a random access memory using a layered film of oxide high-temperature superconductor—non-superconductor—oxide high-temperature superconductor wherein the flux quantum is acting as the information bit. In FIG. 1, the reference number 1 shows the lower layer oxide high-temperature superconductor thin film (for example, NdBaCuO thin film), 2 shows the lower layer non-superconductor thin film (for example, PrBaCuO thin film), 3 shows the upper layer oxide high-temperature superconductor thin film (for example, NdBaCuO thin film), and 4 shows the upper layer non-superconductor thin film (for example, PrBaCuO thin film). Further, 5 and 6 show a control current line formed by a metal thin film (for example, Au) wherein $I_{RX}$ (5) is magnetically coupled with a superconductor loop in layer 3 and $I_{WX}$ (6) is magnetically coupled with a superconductor loop in layer 1.

Further, one portion of said lower layer oxide high-temperature superconductor thin film 1 is a bias current line $I_{WY}$ (8), one portion of said upper layer oxide high-temperature superconductor thin film 3 is a bias current line $I_{RY}$ (7). The thin films of the superconductor layer 1, the non-superconductor layer 2, the superconductor layer 3 and the non-superconductor layer 4 each have a penetrating hole, and a loop is formed at each of said layers with this hole at its center. Two Josephson junctions (FIB junctions) 9 and 10 are formed at the loop of the superconductor layer 1, and two Josephson junctions (FIB junctions) 11 and 12 are formed at the loop of the superconductor layer 3. The bias current line $I_{WY}$ (8) is connected to the superconducting loop with the two Josephson junctions (FIB junctions) 9 and 10, and the bias current line $I_{RY}$ (7) is connected to the superconducting loop with the two Josephson junctions (FIB junctions) 11 and 12.

Of these, the superconducting quantum interference device (SQUID) formed at the superconductor layer 1 and consisted of junctions 9 and 10 and the bias line 8 and the control line 6 is the memory storage superconducting quantum interference device 13 holding the flux quantum to its loop as a memory information, and the superconducting quantum interference device (SQUID) formed at the superconductor layer 3 and consisted of junctions 11 and 12 and the bias line 7 and the control line 5 is the read superconducting quantum interference device (SQUID) 14 for reading the polarity of the flux quantum held as the memory information.

Further, in FIG. 1, the substrate formed of an oxide high-temperature superconductor utilized as the superconducting ground plane and the non-superconducting layer formed on said substrate is omitted from the drawing.

Figure 2:
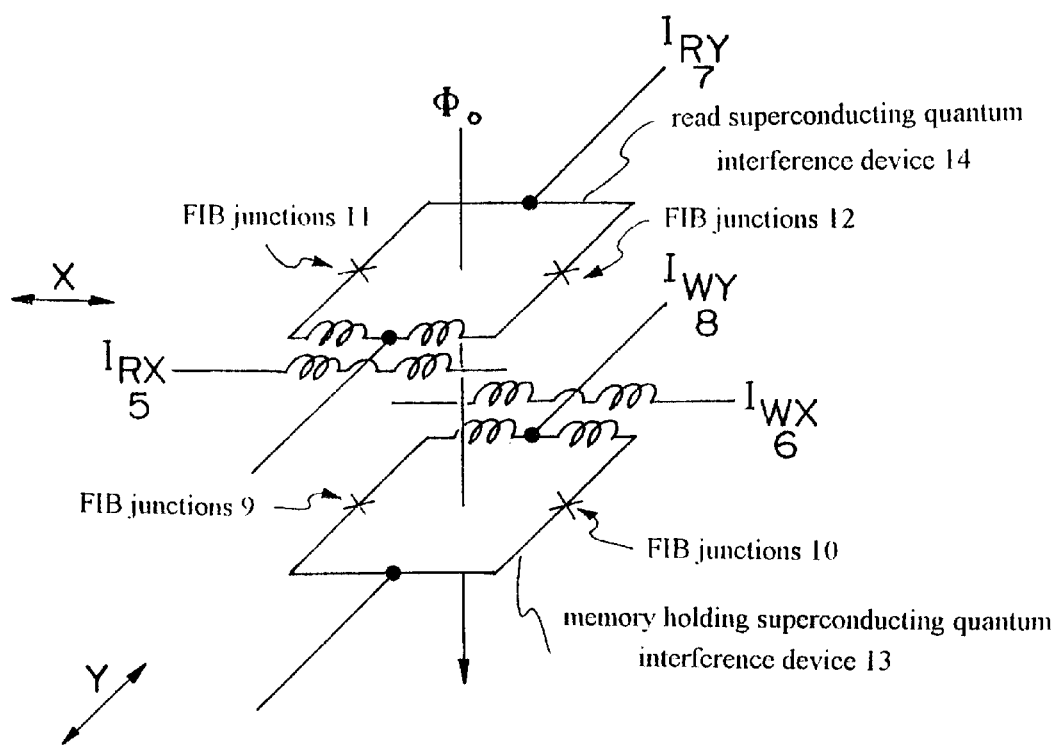
FIG. 2 is an equivalent circuit of the memory cell of the present invention.

FIG. 2 shows the equivalent circuit of the memory cell of the present invention.

[Explanation of the Structure]

Figure 3:
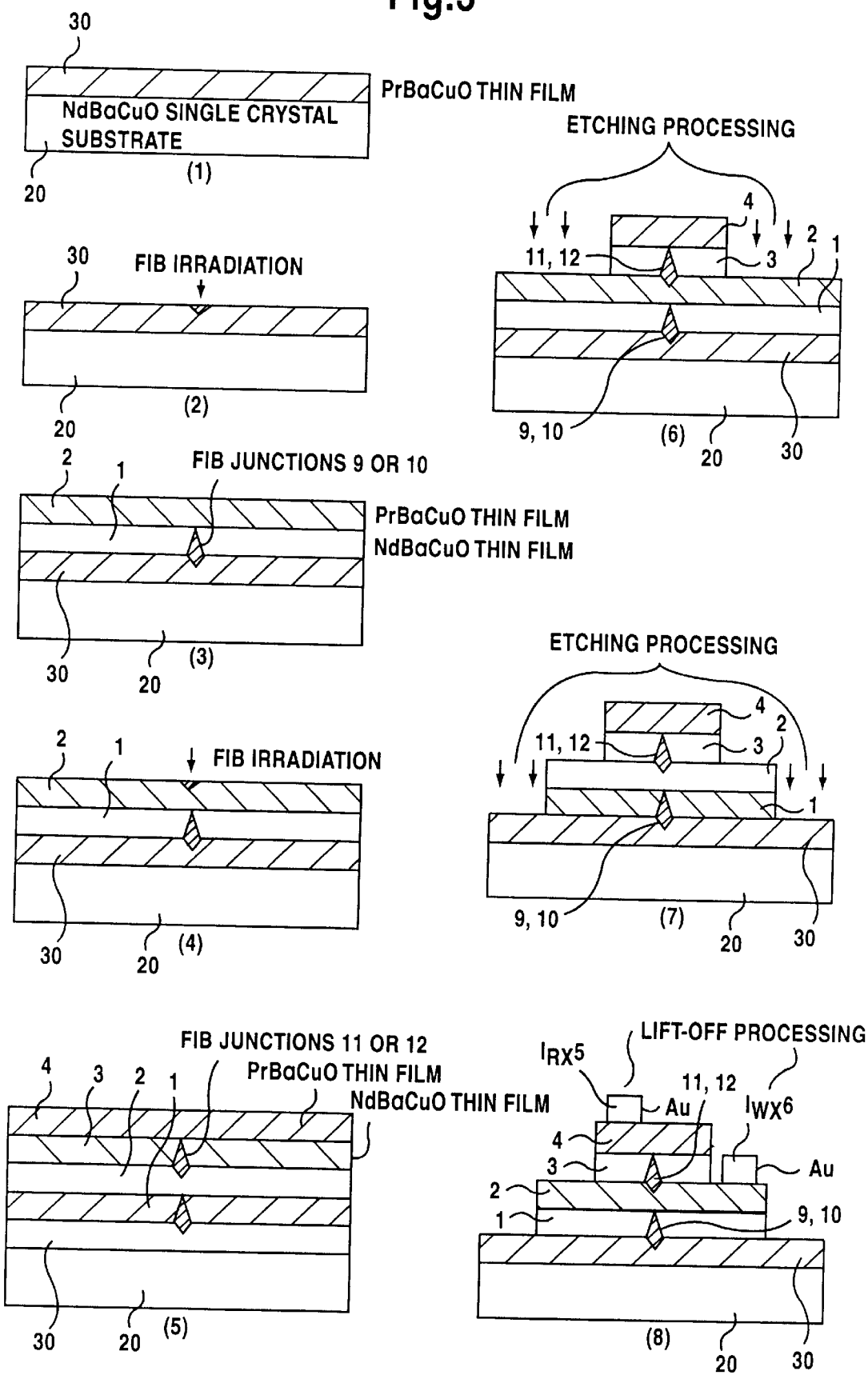
FIG. 3 is a fabrication process view showing the method of manufacturing the memory cell of the present invention.

FIG. 3 is a fabrication process view showing the method of manufacturing the memory cell of the present invention. A NdBaCuO single crystal is used as the substrate 20, and a PrBaCuO thin film 30 is epitaxially grown on the surface thereof. Then, one portion of the surface of said PrBaCuO thin film 30 is irradiated with FIB, and then NdBaCuO thin film 1 and PrBaCuO thin film 2 is epitaxially grown thereto, forming a lower layer Josephson junction 9 and 10. Then again, one portion of the surface of said PrBaCuO thin film 2 is irradiated with FIB, and then NdBaCuO thin film 3 and PrBaCuO thin film 4 is epitaxially grown thereto, forming an upper layer Josephson junction 11 and 12.

Next, the NdBaCuO—PrBaCuO layered film of the upper layer and the NdBaCuO—PrBaCuO layered film of the lower layer is etched twice from the surface in order to form a superconducting loop including two FIB Josephson junctions (DC-SQUID) and a bias current line to the layered film of the upper layer and the lower layer. Then, a magnetically coupled control current line is formed to each of said superconducting loops by growing a metal thin film and then providing a lift-off processing.

It is also possible to form the lower layer Josephson junction and the upper layer Josephson junction by one FIB irradiation.

[Explanation of the memory operation]

In the present memory, the polarity of the magnetic flux of the flux quantum held at the memory storage superconducting quantum interference device (SQUID) 13 corresponds to the "1" and "0" of the memory. Here, the direction of the flux quantum $\phi_0$ (the polarity of the magnetic flux) of FIG. 2 is explained as "1".

Figure 4:
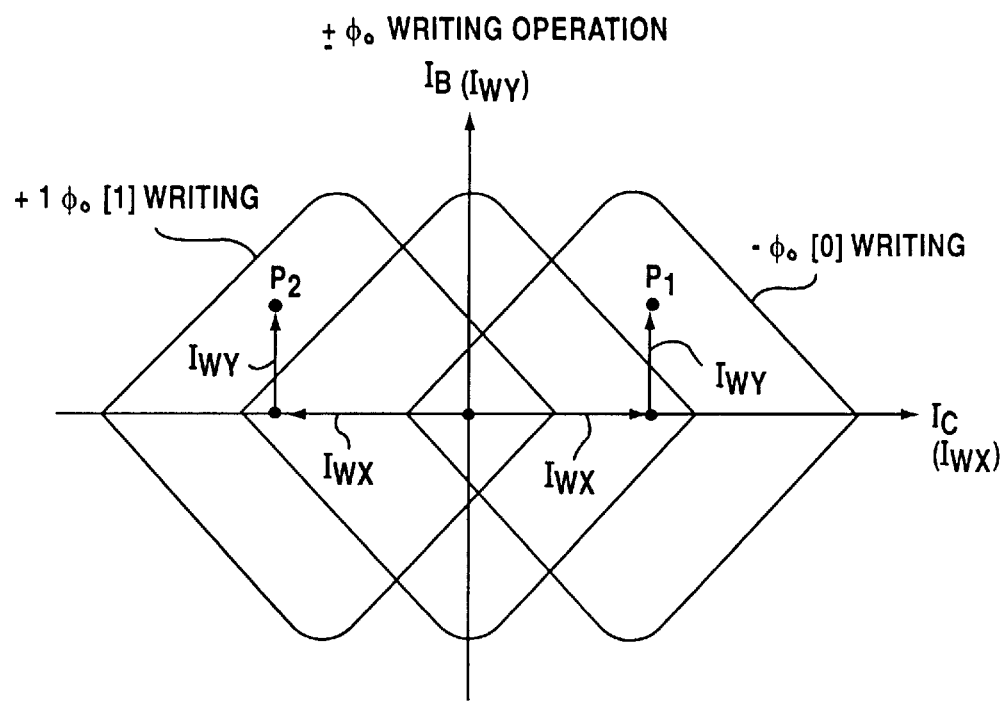
FIG. 4 is an explanatory view showing the writing operation of the information to the memory storage superconducting quantum interference device (SQUID)

FIG. 4 shows the writing operation.

The writing operation is performed at the writing bias current line $I_{WY}$ (8) and the writing control current line $I_{WX}$ (6). The cell selection is a coincident selection method of line X and line Y. FIG. 4 shows a threshold value for explaining the writing operation. The horizontal axis is the control current $I_C$ flown in the current line $I_{WX}$ (6) and the vertical axis is the bias current $I_B$ flown in the current line $I_{WY}$ (8), which shows the voltage occurrence threshold (Josephson current value $I_j$) of the bias current $I_B$. The inner side of the curve including a point of origin on this threshold characteristics shows the state where flux quantum is not held in the memory storage superconducting quantum interference device (SQUID) 13. The curve on the plus side of the control current axis $I_C$ shows that when an operating point $P_1$ exists in its inner portion, one flux quantum having a minus polarity (in other words, memory information "0") is held at the memory storage superconducting quantum interference device (SQUID) 13. Further, the curve on the minus side of the control current axis $I_C$ shows that when an operating point $P_2$ exists in its inner portion, one flux quantum having a plus polarity (in other words, memory information "1") is held at the memory storage superconducting quantum interference device (SQUID) 13.

For the operation of writing "1", a control current $I_{WX}$ and a bias current $I_{WY}$ are flown so that the operating point comes inside the curve for writing "1" on the threshold characteristics (FIG. 4) of the writing SQUID. When writing "0", the control current $I_{WX}$ and the bias current $I_{WY}$ are flown so that the operating point comes inside the curve for writing "0". That is, whether a "1" or a "0" is written is determined by the polarity of the control current $I_{WX}$.

The LI value (which is the multiplication of a loop inductance L of the memory storage SQUID and a Josephson current value of the Josephson junction ) of the memory storage SQUID 13 is selected as around 1.5 times the amount of magnetic flux quantum so that the stored magnetic flux quantum will be held in the loop even when the bias current and the control current become zero.

The reading of the memory information is done by the reading superconducting quantum interference device (SQUID) 14.

Figure 5:
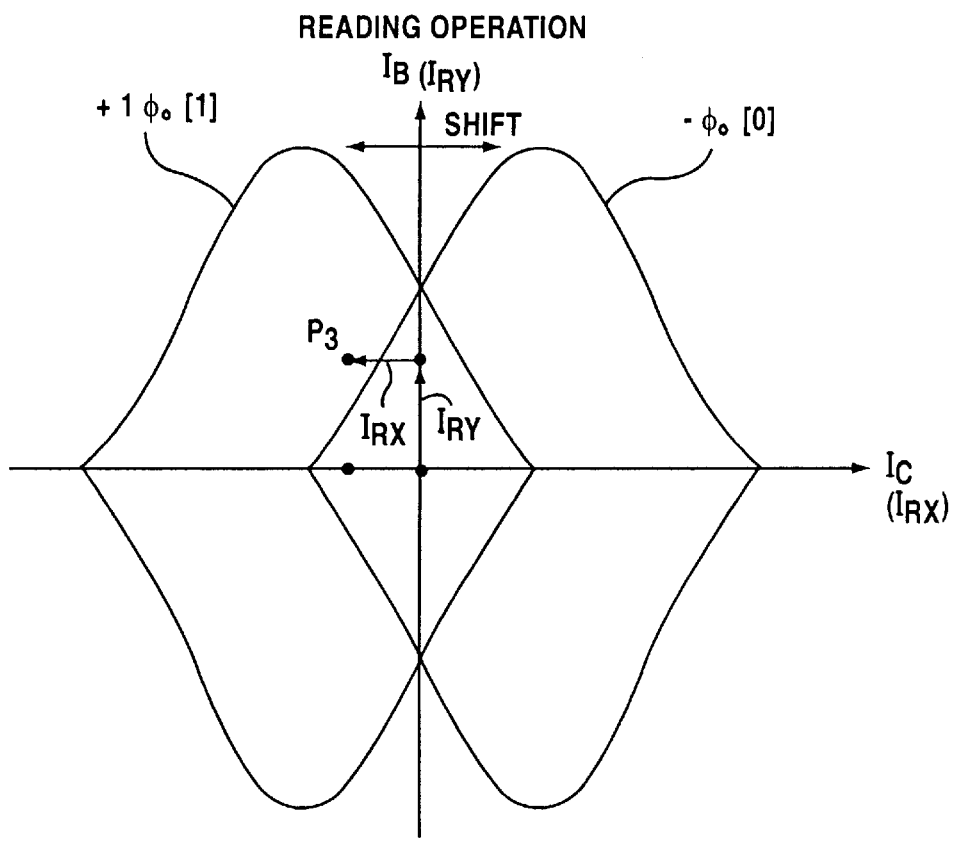
FIG. 5 is an explanatory view showing the reading operation of the information by the read superconducting quantum interference device (SQUID).

The magnetic flux of the flux quantum written into the memory storage superconducting quantum interference device (SQUID) is magnetically coupled to the loop of the reading superconducting quantum interference device (SQUID) 14 positioned on the upper layer. Therefore, as is shown in FIG. 5, the threshold characteristic of the reading superconducting quantum interference device (SQUID) 14 shifts to the direction of the control current axis $I_C$ for a portion equal to the coupled magnetic flux of the held flux quantum depending whether the storage state of the memory is "1" or "0". For example, when the memory is at a "0" state, if the bias current $I_{RY}$ and the control current $I_{RX}$ is flown as is shown in FIG. 5, the operating point $P_3$ goes out of the "0" curve, so that voltage appears across the reading superconducting quantum interference device (SQUID) 14. Therefore, by detecting said voltage, it could be determined that the memory state is "0". Also, when the memory state is "1", even when the same reading operation is executed, the reading superconducting quantum interference device (SQUID) 14 will not output voltage, since the operating point stays inside the curve showing "1". Therefore, by the result of the reading operation, if there was no occurrence of voltage, the memory status could be determined as being "1".

In the writing operation of this memory, the writing control line $I_{WX}$ and the writing bias line $I_{WY}$ is each corresponded to the word line and the bit line, and in the reading operation of this memory, the reading control line $I_{RX}$ and the reading bias line $I_{RY}$ is each corresponded to the word line and the bit line, so any cell could be selected in a random manner for reading and writing. Therefore, a random access memory could be realized.

[Explanation of the performance]

In the present memory, a superconducting Josephson junction can be operated in high speed is used for the reading operation and the writing operation, so the operation speed is extremely fast. Further, since the present memory uses a superconducting Josephson junction, the power consumption is approximately 1/1000 compared to a semiconductor memory, and the heating per unit area is very small. Therefore, device could be mounted in high density, so a very small sized memory of high speed and high density having low wiring delay could be realized.

Further, in the detailed description of the embodiment of the present invention, an embodiment where NdBaCuO thin film was used as the oxide high-temperature superconductor and PrBaCuO thin film was used as the non-superconductor, but the present invention is not limited to these two materials, but any match of high-temperature superconductivity materials where one can be epitaxially grown on the another can be selected.

Further, a metal layer Au is used as the control current line 5 and 6 in FIG. 1. However, it is not necessary to use a metal thin film with normal conductivity, but it could be an oxide high-temperature superconductor or any other conductor if it is technically possible.

[Effect of the Invention]

According to the present invention, a superconducting cash memory of high speed and low power consumption operated by a higher temperature than the liquid helium temperature (4.2K) operation of the prior art, can be provided, which enables great relief of the technical difficulties accompanied by the cold mounting, and greatly reduces the cooling cost.

We claim:

1. A high-temperature superconducting random access memory comprising a three-layer structure of a first oxide high-temperature superconductor—a non-superconductor—a second oxide high-temperature superconductor, wherein the first oxide high-temperature superconductor layer writes a memory information by capturing a flux quantum at a superconducting loop including a Josephson device and corresponding the polarity of the captured flux quantum to "1" and "0" of a binary logic, and the second oxide high-temperature superconductor layer reads the memory information by detecting the polarity of said flux quantum by a superconducting loop including a Josephson device wherein a portion of said captured flux quantum is coupled magnetically with said superconducting loop of the second oxide high-temperature superconductor.

2. A high-temperature superconducting random access memory comprising:

a substrate;

a non-superconductor layer formed on the substrate;

a first oxide high-temperature superconductor layer formed on said non-superconductor layer;

a non-superconductor layer formed on said first oxide high-temperature superconductor layer; and a second oxide high-temperature superconductor layer formed on said non-superconductor layer; wherein said first oxide high-temperature superconductor layer forms a first superconducting loop including a Josephson device, and said second oxide high-temperature superconductor layer forms a second superconducting loop including a Josephson device;

said first superconducting loop constitutes a memory storage superconducting quantum interference device for holding the flux quantum provided by a current line, and said second superconducting loop coupled magnetically to the first superconducting loop constitutes a reading superconducting quantum interference device with a current line for detecting the flux quantum; and the writing and reading of the information is performed by corresponding the polarity of the flux quantum captured in the first superconducting loop with "1" and "0" of a binary logic, and by detecting the polarity of said flux quantum with the second superconducting loop.

3. The high-temperature superconducting random access memory of claim 1 or claim 2, wherein said oxide high-temperature superconductor layer is, for example, a NdBaCuO layer, and said non-superconductor layer is, for example, a PrBaCuO layer.

4. The high-temperature superconducting random access memory of claim 1 or claim 2, wherein said Josephson device is formed by irradiating a focused ion beam (FIB).

5. The high-temperature superconducting random access memory of claim 1 or claim 2; wherein said oxide high-temperature superconductor layer is, for example, a NdBaCuO layer, and said non-superconductor layer is, for example, a PrBaCuO layer; and said Josephson device is formed by irradiating a focused ion beam (FIB).

6. The high-temperature superconducting random access memory of claim 1 or claim 2, wherein the Josephson device of said first superconducting loop and the Josephson device of said second superconducting loop is formed by irradiating a focus ion beam (FIB) once.

7. The high-temperature supercoducting random access memory of claim 1 or claim 2; wherein said oxide high-temperature superconductor layer is, for example, a NdBaCuO layer, and said non-superconductor layer is, for example, a PrBaCuO layer; and said Josephson device of said first superconducting loop and the Josephson device of said second superconducting loop is formed by irradiating a focus ion beam (FIB) once.

* * * * *

UNITED STATES PATENT AND TRADEMARK OFFICE
CERTIFICATE OF CORRECTION

PATENT NO.:   5,942,765
DATED     :   August 24, 1999
INVENTOR(S):  MIYAHARA et al.

It is certified that an error appears in the above-identified patent and that said Letters Patent is hereby corrected as shown below:

On the title page of the patent, in item [73], insert the second assignee, --Nippon Telegraph and Telephone Corporation, Tokyo, Japan-- as it was omitted.

Signed and Sealed this

Fourteenth Day of March, 2000

*Attest:*

Q. TODD DICKINSON

*Attesting Officer*    Commissioner of Patents and Trademarks